(12) United States Patent
Nentwig

(10) Patent No.: US 6,614,303 B2
(45) Date of Patent: Sep. 2, 2003

(54) SIGNAL DEPENDENT CURRENT CONTROLLED AMPLIFIER AND METHOD OF PERFORMING SAME

(75) Inventor: Markus Nentwig, Helsinki (FI)

(73) Assignee: Nokia Mobile Phones, Ltd., Espoo (FI)

( * ) Notice: Subject to any disclaimer, the term of this patent is extended or adjusted under 35 U.S.C. 154(b) by 5 days.

(21) Appl. No.: 09/932,428

(22) Filed: Aug. 17, 2001

(65) Prior Publication Data

US 2003/0034840 A1 Feb. 20, 2003

(51) Int. Cl.[7] .................................................. H03F 3/45
(52) U.S. Cl. ........................................ 330/254; 330/261
(58) Field of Search ................................ 330/254, 261, 330/136, 285

(56) References Cited

U.S. PATENT DOCUMENTS

| | | | | |
|---|---|---|---|---|
| 5,216,379 A | * | 6/1993 | Hamley | 330/134 |
| 5,432,475 A | * | 7/1995 | Fukahori | 330/254 |
| 5,564,092 A | * | 10/1996 | Grandfield et al. | 455/232.1 |
| 5,986,501 A | * | 11/1999 | Rafati et al. | 330/254 |
| 6,107,880 A | * | 8/2000 | Shaw | 330/136 |
| 6,201,441 B1 | * | 3/2001 | Suematsu et al. | 330/51 |
| 6,304,145 B1 | * | 10/2001 | Laureanti et al. | 330/285 |
| 6,404,285 B1 | * | 6/2002 | Shkap | 330/261 |

FOREIGN PATENT DOCUMENTS

EP          0999649          5/2000

* cited by examiner

*Primary Examiner*—Michael Tokar
*Assistant Examiner*—Khai Nguyen
(74) *Attorney, Agent, or Firm*—Ware, Fressola, Van Der Sluys & Adolphson LLP

(57) ABSTRACT

A low-noise amplifier for radio frequency signals uses the magnitude of the input signal to adjust the output current of a current source if the input signal magnitude exceeds a predetermined value. The current source provides operating current to the low-noise amplifier. Compensation for gain reduction due to large input signal magnitude is therefore achieved by increasing the gain of the low noise amplifier in such situations by increased operating current. As a result, power consumption savings and better linearization are achieved, especially for such low-noise amplifiers used in mobile receivers.

17 Claims, 3 Drawing Sheets

SIGNAL DEPENDENT CURRENT CONTROLLED AMPLIFIER AND METHOD OF PERFORMING SAME

TECHNICAL FIELD

The present invention is directed to low-noise amplifiers for use in global radio frequency receivers.

BACKGROUND OF THE INVENTION

With the advent of third generation wireless systems using wide band CDMA (W-CDMA) technology, mobile receivers will typically be operating in a continuous fashion. This is to be distinguished from prior generation wireless receivers such as GSM receivers which are turned on only for a fraction of the time. As a result, there is a need for a new type of differential low-noise amplifier (LNA) arrangement for such mobile radio frequency receivers and in particular, to maintain power consumption of such receivers at low levels in order to increase operating time of the mobile appliance with limited battery capacity.

Thus prior art, conventional RF receivers use LNA designs that consume power at essentially a constant rate regardless of the input signal. In the prior art, conventional radio frequency (RF) receivers use LNAs with a constant current source to provide power to the LNA.

Linear amplifiers with signal-dependent power consumption are widely used for certain types of audio amplifiers and in particular, Class AB amplifiers, as well as for other low-frequency applications. Although there are some commercially available LNAs which allow the current to change through use of a control signal in order to trade-off power consumption against linearity of the LNA, there is no known solution which adapts power consumption to the signal level automatically. In European application 0 999 649, a method and arrangement for linearizing a radio receiver is disclosed. In this prior art document, the mobile receiver monitors signal strength on the received channel as well as neighboring channels so as to determine the quality of the detected signal through one of several means. If the signal strength is satisfactory, the supply currents at the front end of the amplifier, and at a first mixer of the receiver are kept relatively small. If however, the signal strength falls below a predetermined value or if neighboring channels exceed a predetermined value, the supply currents are increased so as to obtain better linearity of the amplifier. This European application does not however disclose a solution to minimize power consumption of a high-frequency, low-noise amplifier; and in particular to minimize power consumption when the input signal is below a predetermined value and to increase the current flow of the low-noise amplifier and increase power consumption when input power levels are increased, thereby maintaining better linearity of the LNA when high input signals are present.

SUMMARY OF THE INVENTION

The described signal-dependent current controlled low-noise amplifier consumes only approximately twenty-five percent of its maximum current in the absence of a high input signal, which contains the desired signal and possibly interfering signals. In order to achieve this result, a differential low-noise amplifier is described having a current source which is controlled by the magnitude of the input signal. The magnitude of the input signal is obtained through an active rectifier which uses emitter followers for purposes of obtaining such active rectification.

In the absence of a high input signal, the control voltage of the current source is essentially constant and thus the differential amplifier operates at its quiescent current.

At higher input signal levels as a result of a higher value of the desired signal or higher values of interfering signals, the control voltage for the current source follows the instantaneous magnitude of the RF input signal, thereby increasing the output current of the current source. The current-control mechanism thereby generates a variation in the total current at twice the input signal frequency which would be twice the input signal frequency of either the desired signal or the desired signal in combination with interfering signals. The two-times the input frequency is due to the active rectification of the input signal. The current control outputs representing variations in the output current of the current source appear as outputs to the low-noise amplifier in a common mode when the amplifier is a differential low-noise amplifier. The amplified desired signal is seen at the output of the differential LNA in differential mode thereby; easily differentiating that signal from the common mode variation of the output signal.

The gain of the differential amplifier typically decreases for higher input signal levels due to the shape of the voltage/current transfer curve for such differential amplifiers; but the gain of such differential amplifiers is proportional to the total current driving the LNA. Thus increasing the total current by increasing the output current of the current source effectively overcomes the decrease in the gain of the differential amplifier otherwise associated with increased input signal levels.

Thus the optimization goal for the low-noise amplifier circuit according to the present invention is to compensate for the gain loss of the differential amplifier through use of additional current from the current source. At higher signal levels the differential amplifier operates as a limiting amplifier and thus the gain is produced by the current source alone.

In particular since the current gain of the transistors forming the differential amplifier is approximately constant, the instantaneous base current of these transistors is proportional to the instantaneous current through the current source. At high input signal amplitudes (and therefore high currents), a multiple of the quiescent base current flows through either one of the two differential amplifier transistors, depending on the polarity of the RF input signal. The other transistor is then completely blocked. Therefore a special bias network is used which provides a negative return path for the increased signal current flowing through the input signal source. This bias network is able to deliver varying base currents to the differential amplifier while keeping the additional voltage drop at high peak base currents at a sufficiently low value. In addition, the small signal impedance associated with the bias network is high and therefore only a small ratio of the input signal energy is lost leaking into the bias network.

BRIEF DESCRIPTION OF THE DRAWINGS

For a fuller understanding and nature and objects of the present invention, reference should be made to the following detailed description taken in conjunction with the following drawings in which.

BEST MODE FOR CARRYING OUT THE INVENTION

Figure 1:
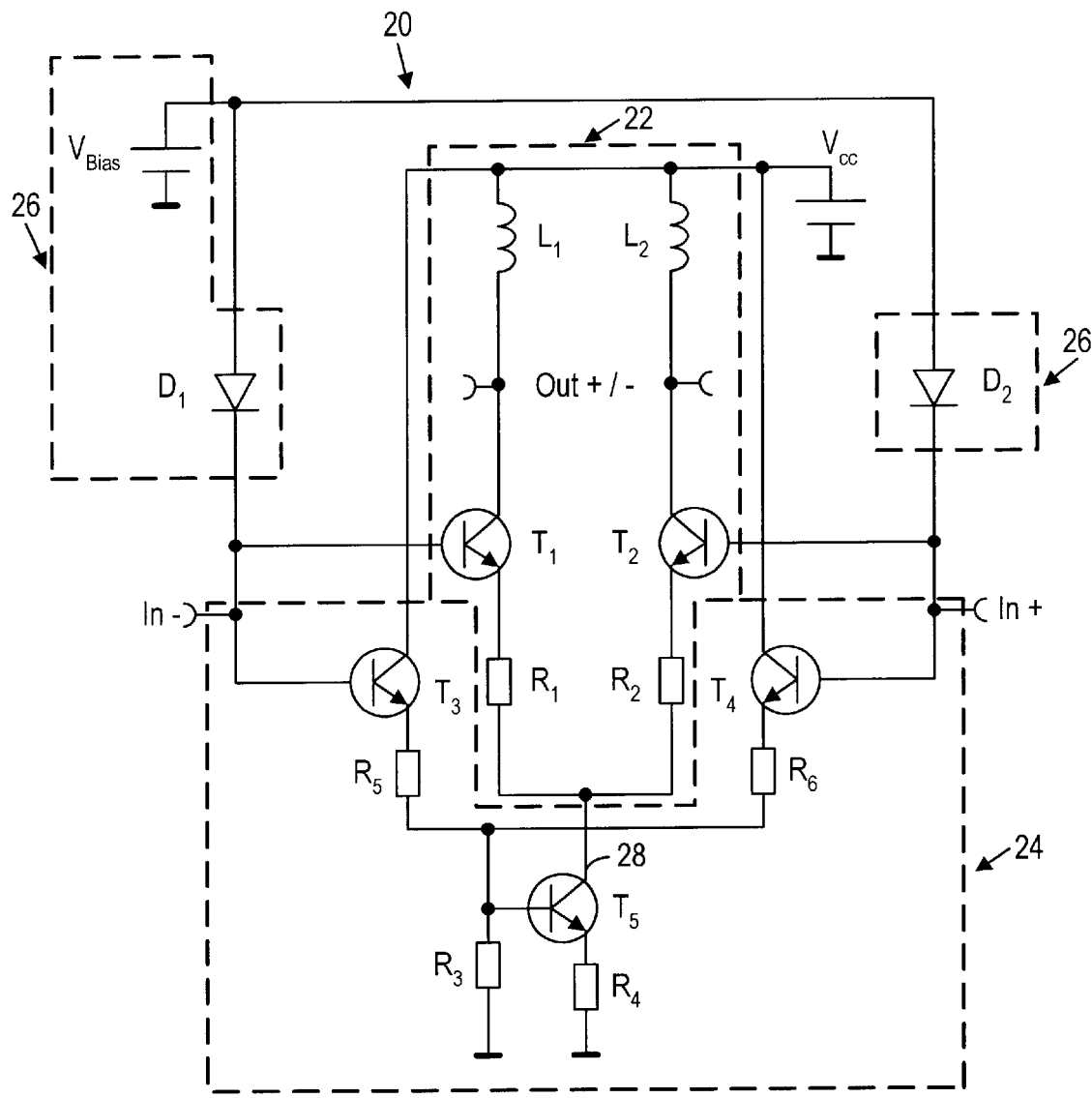
FIG. 1 is a schematic diagram of an input signal dependent current controlled low-noise amplifier according to the present invention.

As best seen in FIG. 1, a signal dependent current controlled low-noise amplifier 20 includes a differential amplifier portion 22, a signal-controlled current source 24 and biasing circuit 26. As seen in FIG. 1, in the absence of strong input signals (containing the desired signal and possible interfering signals) at differential inputs In− and In+ (for input power levels below −30 dBm), the control voltage applied to the base of transistor T5 is essentially constant since the input signal voltage is insufficient to overcome the quiescent base to emitter voltage applied to transistor T3 and T4 and therefore does not drive the transistors into nonlinear operation. At higher input signal levels, the control voltage for the current source follows the instantaneous magnitude of the RF input signal applied to differential inputs In− and In+, because transistors T3 and T4 show nonlinear behavior and feed the rectified input signal to the base of the current source transistor T5.

The current-control mechanism comprises current source transistor T5, and biasing resistors R3 and R4. The control—control mechanism generates a variation in the total current 28 at twice the frequency of the input signal applied to signal input In− and In+ if the signal is sufficiently large. This result is due to the rectification of the input signal caused by the base emitter junctions of transistors T3 and T4. The control-current from the collector of transistor T5 (reference numeral 28) in turn controls the current flow into the emitters of differential amplifier transistors T1 and T2. Thus, any increase or decrease in the collector current of transistor T5 appears as a common mode increase or decrease in the voltage which appears across differential outputs OUT+ and OUT−. The desired amplified signal from inputs In− and In+ of course appears at the same outputs in a differential-mode.

The gain of the differential amplifier 22 normally decreases for higher input signal levels due to the voltage/current transfer curve for transistors T1 and T2. This voltage/current transfer curve typically has a hyperbolic tangent shape.

The optimization goal of the current control low-noise amplifier according to the present invention is to compensate for the gain loss in the differential amplifier 22 through increase of the current supplied to the differential amplifier by increasing the collector current of the signal-controlled current source 24. Thus at high input signal levels, the differential amplifier operates as a limiting amplifier and the gain produced is based upon the current source alone. Since the current gain of differential amplifier transistors T1 and T2 is approximately constant, the instantaneous base current of transistors T1 and T2 is proportional to the instantaneous current through the current source. At high signal amplitudes (and consequently high currents), a multiple of the quiescent base current flows through the base of either T1 or T2 depending upon the polarity of the RF input signal applied to inputs In− and In+. The other transistor (T1 or T2) is then in the OFF state. Therefore it is necessary that a bias network be presented to provide a negative return path for the increased signal current flowing through the signal source. The bias network 26 comprises diodes D1 and D2 and voltage source $V_{Bias}$ so as to deliver varying base currents to the differential amplifier transistors T1 and T2 while keeping the additional voltage drop at high peak base currents relatively small. Also, the small-signal impedance for the bias circuit is high, which minimizes dissipation of signal energy in the bias circuit in the presence of small signal levels.

Again referring to FIG. 1, the overall current controlled low-noise amplifier 20 would require a matching network (not shown) at the input In− and In+ towards the preceding stage to minimize loss of signal energy caused by mismatch. The collector current for the differential amplifier transistors T1 and T2 is provided through inductors L1 and L2. It should be noted that other types of biasing networks using resonators, resistors and the like are also possible. Further, a higher output power can be achieved by using parallel resonators instead of inductors L1 and L2, which are tuned to the frequency of the wanted signal. The resonators present a low impedance to the common-mode component at twice the signal frequency, while maintaining a high impedance towards the wanted signal. The common-mode component will be effectively shorted, therefore reducing its voltage-swing at the output.

As noted above, the differential amplifier 22 comprises inductors L1 and L2, transistors T1 and T2 and resistors R1 and R2. The supply voltage Vcc (such as 2.7V) is supplied to both the differential amplifier 22 and to the signal-controlled current source 24. The differential amplifier is emitter-degenerated through resistors R1 and R2.

The signal-controlled current source 24 comprises drive transistors T3 and T4, current source transistor T5, and resistors R3, R4, R5 and R6 and uses the input signal arriving at input In− and In+. In order to achieve a signal-dependent power consumption configuration, the input signal is presented to the base of transistor T3 and to T4 in a manner as shown in FIG. 1. The output current from transistors T3 and T4, based upon the instantaneous magnitude of the input signal effectively can control the base current drive to current source transistor T5. As explained above, if the input signal is sufficiently low (small signal situation, input power levels below 30 dBm), the control voltage at the base of current control transistor T5 is essentially constant based upon the quiescent biasing of transistors T3 and T4 via diodes D1 and D2. At higher input signal levels, the control voltage for the current source follows the instantaneous magnitude of the RF input signal, thereby increasing the collector current of transistor T5 and thus the drive current to the differential amplifier. This arrangement effectively compensates for the decreased gain of the differential amplifier at higher input signal levels. Resistor pairs R1/R2, R5/R6 and resistors R3, R4 are chosen in such a way that the gain increase due to additional current to differential amplifier 22 (collector current 28 of transistor T5) effectively compensates for the inherent loss of gain of the differential amplifier for higher power (input signal) levels. The values of resistors R1 and R2 should be small (zero to 30 ohms), in order to obtain a small noise figure for the total amplifier. Resistor R4 should have a small value (zero to 30 ohms). The values of resistors R5 and R6 should be high (hundreds of ohms to several kiloohms) in order to reduce the quiescent current through R3, while obtaining optimum linearity for the whole circuit. By optimizing these resistors, it is possible to achieve a high linearity up to the compression point (1-dB) of the amplifier.

The biasing network 26 comprises diodes D1 and D2 in conjunction with bias voltage source $V_{Bias}$. Diodes D1 and D2 provide the necessary base current to the differential amplifier transistors T1 and T2 and the signal-controlled current source 24 through transistors T3, T4. The small-signal impedance of the diodes is high (typically in the kiloohm range). Thus when high input signal levels increase the average current through the differential amplifier by a factor of 4, the bias network is able to deliver a peak current equal to approximately 5.6 times that total quiescent base current for transistors T1 and T2. At the peak of the input signal voltage, the base current flows for example, through diode D1 out of the input terminal In−, through the signal source and into the other input In+ and then to the base of transistor T2. Of course the flow could be in the opposite direction through diode D2, input terminal In+, through the signal source into the input terminal In− and then into the base of transistor T1, depending upon the polarity of the input signal. Furthermore, due to the exponential characteristic of the voltage/current curve of the diodes, the added voltage drop from these diodes is relatively small.

Measurement Results:

A sample circuit according to the present invention was manufactured using ST BICMOS6G silicon-germanium (Si—Ge) process for the active circuitry and the MAS20p process for the glass substrate.

In this circuit, filters with narrow bandwidth such as 100 megahertz bandwidth at 1.8 gigahertz center frequency are used at the input and output of the amplifier 20 for matching and biasing. The insertion loss of the filters reduces the total gain and increases the noise figure. Changing the design to a broadband amplifier should reduce the noise figure and increase the gain significantly. The measured gain for the sample circuit, including filter losses, was 0.6 dB while the noise figure was 5.2 dB. Taking filter losses into account, the gain of the amplifier alone is approximately 10 dB.

Figure 2A:
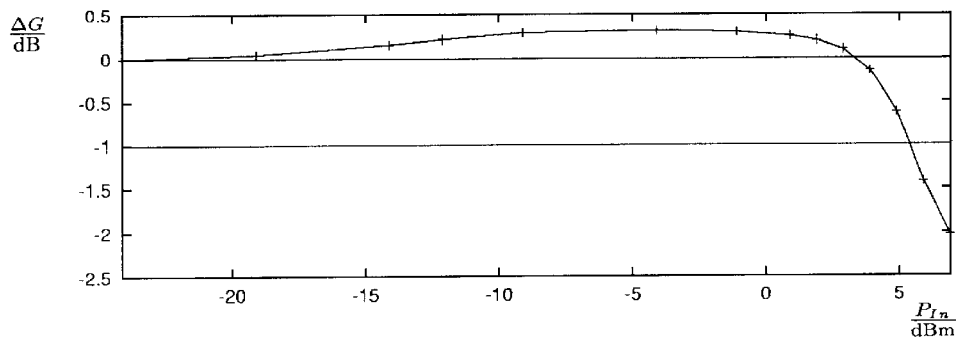
FIGS. 2A, 2B, 2C and 2D are plots showing various measurement results for the circuit shown in FIG. 1 based upon a one-tone test signal.
Figure 2B:
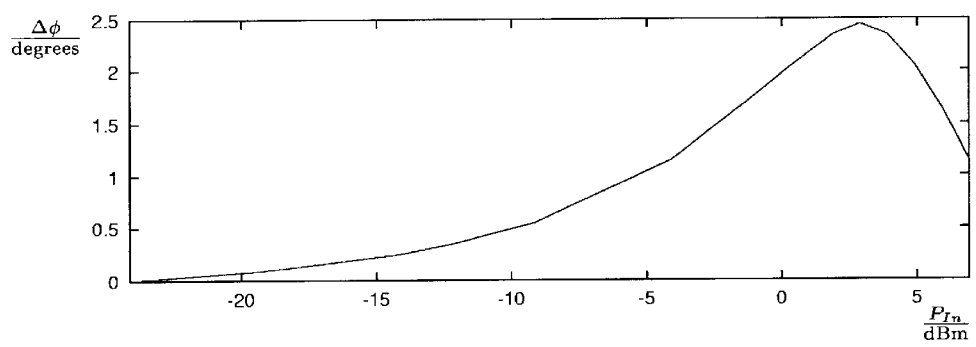
Figure 2C:
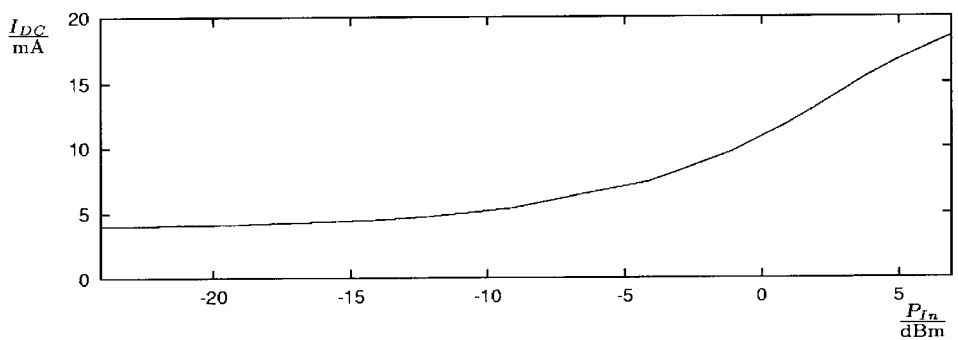
Figure 2D:
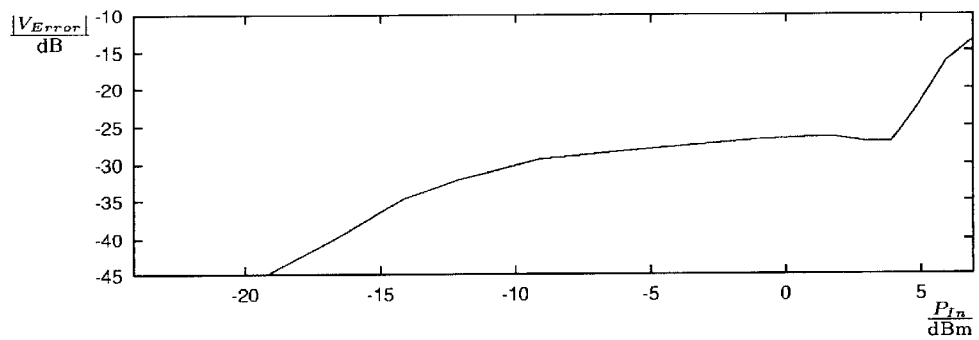

One-Tone Measurement Results:

FIGS. 2A–2D show the one-tone measurement result for the sample circuit. The following results were measured with a network analyzer. The power source at the input terminal was set to a frequency of 1.8 gigahertz. Its power level was swept and the change in $S_{21}$ was observed; that is, the ratio between the input signal and the output signal, in both amplitude and phase. The loss between the analyzer's source and the device under test (DUT) was taken into account in these measurements. Thus FIG. 2A illustrates the change in gain vs. input power $\Delta G$. FIG. 2B shows the change in phase vs. input power $\Delta \Phi$. FIG. 2C illustrates the DC current consumption vs. input power $I_{DC}$. Finally, FIG. 2D shows the total vector error vs. input power $|V_{Error}|$. The vector error was calculated as the difference between the large signal $S_{21}$ at $P_{In}$ and the small signal $S_{21}$.

Interpretation of One-Tone Measurement Results:

As seen in FIGS. 2A–2D, the sample circuit shows a small gain increase at signal levels of −20 dBm and higher. At 3 dBm, the gain drops again down to the small-signal gain. The input-referred 1-dB gain compression point is seen to be 5 dBm. The highest phase error occurs close to the compression point and is at 2.50. It is seen that the quiescent current is 4 milliamperes and it increases by a factor of 4 at the compression point. The effect of the linearization can be clearly seen from the vector error. It is seen to be similar to that of a conventional amplifier up to the point where the current control mechanism starts to increase the total current at an input power of approximately −15 dBm. Then the slope reduces, reaching a plateau where it remains smaller than 25 dB up to the compression point.

Figure 3:
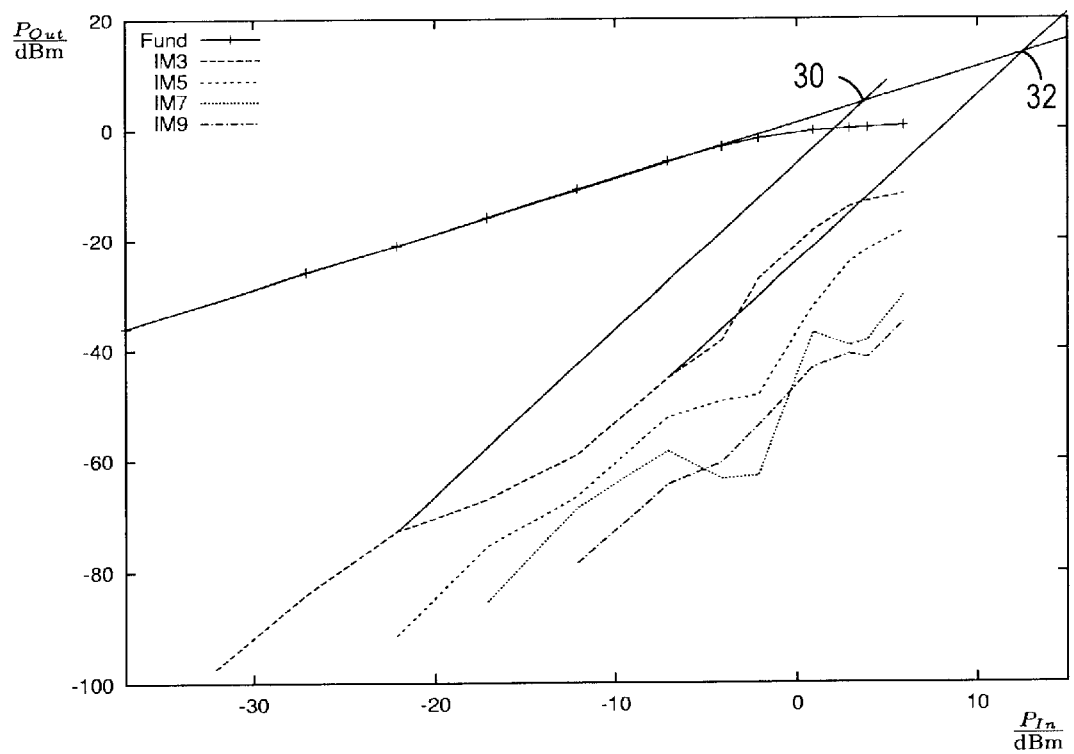
FIG. 3 is a plot of various measurement results for the circuit shown in FIG. 1 based upon a two-tone test signal.

Two-Tone Measurement Results:

FIG. 3 illustrates the two-tone measurement results for the sample circuit. The following results were obtained by feeding two closely spaced RF signals (at 1.799 GHz and 1.801 GHz) into the circuit at inputs In− and In+ and measuring the components of the output signal with a spectrum analyzer at outputs Out+ and Out−. As seen in FIG. 3, the fundamental component (Fund) is at 1.801 GHz. Third, fifth, seventh and ninth order intermodulation (IM) products are also shown in the figure with the labeling as indicated in the figure (IM3, IM5, IM7, IM9). FIG. 3 shows the output signal components vs. source power (which has been set on each of both sources). The losses between the generators and the device under test input have been taken into account. The plot shows straight line-approximations through the fundamental output signal (slope of 1) and the third order intermodulation (IM) product (slope of 3, two lines).

Interpretation of Two-Tone Measurement Results:

It can be readily seen in FIG. 3 that the increase in current (starting at approximately −23 dBm) leads to a significant improvement in linearity, wherein the third order IM product drops up to 15 dB below its straight-line extension. The third order intercept point 30 is defined as the intersection of the straight line-approximations of the fundamental and third order IM-response. Calculating the intercept point 30 in the conventional way through interpolating from very small signal levels results in an input-referred third order intermodulation intercept point of 3 dBm. This particular number is not believed to be especially meaningful because the linearization mechanism improves amplifier performance for higher input signal levels. Using higher input power (−10 dBm) leads to a more realistic input-referred third order intermodulation intercept point of 12 dBm as seen in the second line of FIG. 3 at intercept point 32. The higher-order intermodulation products are below the third order intermodulation product for all reasonable input powers.

SUMMARY

It is thus seen that the present invention is directed to an input signal dependent current controlled differential amplifier such as for operation at gigahertz frequencies. The amplifier exhibits signal-dependent power consumption as a result of the linearization mechanism which is based upon a signal-controlled current source for increasing the gain of the differential amplifier for large input signals. This signal-dependent power consumption saves approximately seventy-five percent of the total power consumption of the amplifier in the absence of strong interferers; that is, interfering signals (if present) in addition to the desired signal as presented to the amplifier through input In− and In+. The measured results as shown in FIGS. 2A–2D and 3 show a significant increase in linearity for high signal levels as compared to similar differential amplifiers without this circuit arrangement. The simulated behavior of the current control mechanism and the actual measurement results substantially agree.

The overall current controlled amplifier consumes approximately 16 milliamps at the 1-dB compression point (ca 5 dBm at the input for in-band signals), and only consumes approximately 4 milliamperes in the absence of strong signals. Intermodulation measurements show excellent linearity for large input signals. Using the large-signal measurement result, the input-referred third order intermodulation intercept point is 12 dBm. Gain and phase error measurements demonstrate that the vector error is small, even for high signal levels and its magnitude remains well below −25 dB close to the compression point of the amplifier.

Having described the invention, what is claimed is:

1. A method for reducing the power consumption of a differential amplifier for use in mobile radio frequency receivers having its operating current controlled by a current source, wherein an input signal which is or contains a desired subsequently detected; comprising the steps of:

varying the output current of the current source to follow the instantaneous magnitude of the input signal if the input signal is greater than a predetermined value; and controlling the gain of the differential amplifier in response to the output current of the current source so that the gain of the differential amplifier is increased by the increased output current of the current source so as to compensate for the normal gain decrease of the differential amplifier in response to the input signal being greater than the predetermined value and so that the total power consumption of the amplifier is reduced when such input signal is below the predetermined value.

2. A method as defined in claim 1, wherein the current source output appears as a common mode output of the differential amplifier while the desired signal is a differential signal at the output of the differential amplifier.

3. A method as defined in claim 2, wherein the variation of the output current of the current source is at twice the frequency of the input signal.

4. A method as defined in claim 1, wherein the predetermined value is based upon the instantaneous magnitude of the input signal exceeding the quiescent base to emitter voltage of drive transistors used in the step of varying the output current of the current source.

5. A method for reducing the power consumption of an amplifier having its operating current controlled by a current source, wherein an input signal is amplified, comprising the steps of:

varying the output current of the current source to follow the magnitude of the input signal if the input signal is greater than a predetermined value; and controlling the gain of the amplifier in response to the output current of the current source;

whereby the gain of the amplifier is controlled by the increased output current of the current source so as to compensate for the gain decrease of the amplifier in response to the input signal being greater than the predetermined value and so that the total power consumption of the amplifier is reduced when such input signal is below the predetermined value.

6. A method as defined in claim 5, wherein the amplifier is a differential amplifier and wherein the current source output appears as a common mode output of the differential amplifier while the desired signal is a differential signal at the output of the differential amplifier.

7. A method as defined in claim 6, wherein the variation of the output current of the current source is at twice the frequency of the input signal.

8. A method as defined in claim 5, wherein the predetermined value is based upon the instantaneous magnitude of the input signal exceeding the base to emitter voltage of drive transistors used in the step of varying the output current of the current source.

9. A circuit arrangement for reducing the power consumption of a differential amplifier for use in mobile radio frequency receivers, wherein an input signal which is or contains a desired signal received from an antenna is amplified and the amplified desired signal is subsequently detected, comprising:

means for receipt of the input signal;

a current source;

means for varying the output current of the current source to follow the instantaneous magnitude of the input signal if the input signal is greater than predetermined value; and means for supplying the output current of the current source to the differential amplifier so that the gain of the differential amplifier is increased by the increased output current of the current source so as to compensate for the normal gain decrease of the differential amplifier in response to the input signal being greater than the predetermined valve so that the power consumption of the amplifier is reduced when such input signal is below the predetermined valve.

10. A circuit arrangement as defined in claim 9, wherein the current source output appears as a common mode output of the differential amplifier while the desired signal is a differential signal at the output of the differential amplifier.

11. A circuit arrangement as defined in claim 10, wherein the variation of the output current of the current source is at twice the frequency of the input signal.

12. A circuit arrangement as defined in claim 9, wherein the current source comprises a transistor with resistive biasing with the collector output of the transistor being the current source output.

13. A circuit arrangement as defined in claim 9, wherein the means for varying the output current of the current source so as to follow the instantaneous magnitude of the input signal if the input signal magnitude is greater than a predetermined value comprises first and second transistors (T3, T4) having base inputs connected to the input signal so as to rectify the input signal for presentation as a control signal to the current source.

14. A circuit arrangement as defined in claim 13, wherein the differential amplifier comprises first and second transistors (T1, T2) and wherein the circuit arrangement further comprises a biasing circuit connected to the differential amplifier for providing additional base current to the transistors of the differential amplifier when the input signal is greater than the predetermined value.

15. A circuit arrangement as defined in claim 14, wherein the predetermined value is based upon the instantaneous magnitude of the input signal exceeding the base to emitter voltage of the first and second transistors (T3, T4) of said means for varying the output current of the current source.

16. A circuit arrangement as defined in claim 13, wherein the predetermined value is based upon the instantaneous magnitude of the input signal exceeding the base to emitter voltage of the first and second transistors (T3, T4) of said means for varying the output current of the current source.

17. A circuit arrangement as defined in claim 9, wherein the differential amplifier comprises first and second transistors and wherein the circuit arrangement further comprises a biasing circuit connected to the differential amplifier for providing additional base current to the transistors of the differential amplifier when the input signal is greater than the predetermined value.

* * * * *

UNITED STATES PATENT AND TRADEMARK OFFICE
CERTIFICATE OF CORRECTION

PATENT NO. : 6,614,303 B2
DATED : September 2, 2003
INVENTOR(S) : Markus Nentwig It is certified that error appears in the above-identified patent and that said Letters Patent is hereby corrected as shown below:

Column 4,
Line 37, "30" should be -- -30 --.

Column 5,
Line 52, "2.50" should be -- 2.5° --.
Line 59, "25" should be -- -25 --.

Column 6,
Line 67, after "desired" -- signal received from an antenna is amplified and the amplified desired signal is -- should be inserted.

Column 8,
Line 15, "valve" should be -- value --.

Signed and Sealed this

Sixth Day of January, 2004

JAMES E. ROGAN
*Director of the United States Patent and Trademark Office*